United States Patent
Ahn et al.

(10) Patent No.: US 9,478,464 B2
(45) Date of Patent: Oct. 25, 2016

(54) METHOD FOR MANUFACTURING THROUGH-HOLE SILICON VIA

(71) Applicant: SILICONFILE TECHNOLOGIES INC., Gyeonggi-do (KR)

(72) Inventors: Heui Gyun Ahn, Gyeonggi-do (KR); Sang Wook Ahn, Gyeonggi-do (KR); Yong Woon Lee, Gyeonggi-do (KR); Huy Chan Jung, Gyeonggi-do (KR); Do Young Lee, Gyeonggi-do (KR)

(73) Assignee: SILICONFILE TECHNOLOGIES INC., Gyeonggi-do (KR)

( * ) Notice: Subject to any disclaimer, the term of this patent is extended or adjusted under 35 U.S.C. 154(b) by 0 days.

(21) Appl. No.: 14/888,674

(22) PCT Filed: Apr. 30, 2014

(86) PCT No.: PCT/KR2014/003829
§ 371 (c)(1),
(2) Date: Nov. 2, 2015

(87) PCT Pub. No.: WO2014/178638
PCT Pub. Date: Nov. 6, 2014

(65) Prior Publication Data
US 2016/0163595 A1    Jun. 9, 2016

(30) Foreign Application Priority Data
May 3, 2013    (KR) .................. 10-2013-0049781

(51) Int. Cl.
*H01L 21/768*    (2006.01)
*H01L 21/306*    (2006.01)
*H01L 21/683*    (2006.01)

(52) U.S. Cl.
CPC ... *H01L 21/76898* (2013.01); *H01L 21/30604* (2013.01); *H01L 21/6835* (2013.01); *H01L 21/7684* (2013.01); *H01L 2221/68327* (2013.01); *H01L 2221/68359* (2013.01)

(58) Field of Classification Search
CPC .................. H01L 21/76898; H01L 21/7684; H01L 21/6835; H01L 21/30604; H01L 2221/68327; H01L 2221/68359
USPC .................................. 438/667, 652
See application file for complete search history.

(56) References Cited

U.S. PATENT DOCUMENTS

2010/0090304 A1* 4/2010 Liu ............... H01L 21/76898
                                                    257/432
2010/0224965 A1* 9/2010 Kuo ............... H01L 21/76898
                                                    257/621
2013/0270711 A1* 10/2013 Hebding ............ H01L 21/768
                                                    257/774

FOREIGN PATENT DOCUMENTS

| KR | 1020080016340 | 2/2008 |
| KR | 1020080031168 | 4/2008 |
| KR | 1020120035701 | 4/2012 |
| KR | 1020120087069 | 8/2012 |

* cited by examiner

*Primary Examiner* — Caleen Sullivan
(74) *Attorney, Agent, or Firm* — IP & T Group LLP (57) ABSTRACT

A method for manufacturing a through-hole silicon via (TSV) employs the conventional trench insulation process to readily manufacture a through-hole silicon via (TSV) with achievement of an effective electrical insulation between the through-hole silicon via (TSV) and the silicon.

20 Claims, 7 Drawing Sheets

METHOD FOR MANUFACTURING THROUGH-HOLE SILICON VIA

CROSS-REFERENCE TO RELATED APPLICATIONS

This application is a national stage application of PCT/KR2014/003829 filed on Apr. 30, 2014, which claims priority of Korean patent application number 10-2013-0049781 filed on May 3, 2013. The disclosure of each of the foregoing applications is incorporated herein by reference in its entirety.

TECHNICAL FIELD

Exemplary embodiments of the present invention relate to a method for manufacturing a TSV (through-hole silicon via), and more particularly, to a method for manufacturing the through-hole silicon via employing a conventional trench insulation process and efficiently accomplishing an electrical insulation between the through-hole silicon via and a silicon substrate.

BACKGROUND ART

A 3-dimensional stack package of a packaging technology of a semiconductor integrated circuit includes a plurality of chips, which are stacked, having a same memory storage, and is normally referred to as a stack chip package.

A technology of the chip stack package has advantages to improve a performance of a chip package, reduce a manufacturing cost and be easy of a mass productions by stacking the plurality of chips using a simple manufacturing process. The technology of the chip stack package has disadvantages to be short of a line distribution for an electrical coupling of the chip stack package according as the number or the size of the plurality of chips, which are stacked, increase.

In other words, since a conventional chip stack package is manufactured to couple a bonding pad of each chip to a conductive circuit pattern of a substrate using a wire for an electrical coupling to between the bonding pad of each chip and the conductive circuit pattern of the substrate under a circumference where a plurality of chips are stacked in a chip stack region of the substrate, the conventional chip stack package needs an additional space for a wire bonding within a chip package and a conductive circuit pattern of the substrate to which a wire is coupled, and has disadvantages to increase a size of the chip package.

In order to consider these points, a structure using a TSV as an example of a stacked package has been developed. In recent, a method for forming a through-hole electrode composed of a conductive material within a semiconductor chip and electrically coupling semiconductor chips through the through-hole electrode has been used.

The TSV is formed through a via-first process, a via-middle process and a via-last process according to a forming time of the via-hole.

Figure 1A:
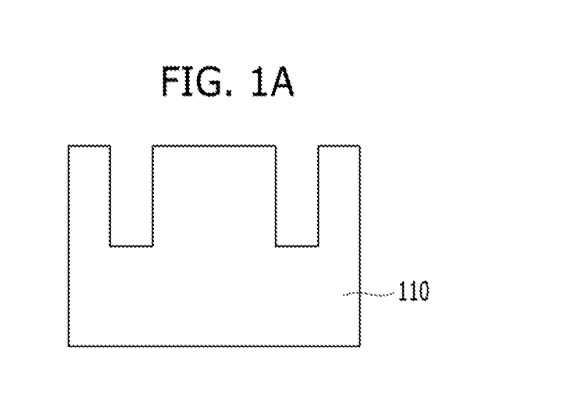
FIGS. 1A to 1C are cross sectional views illustrating a conventional TSV forming process.
Figure 1B:
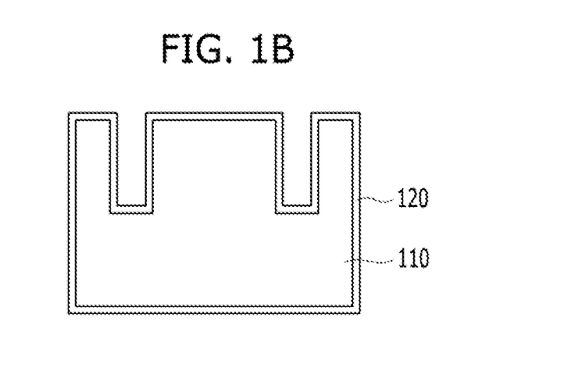
Figure 1C:
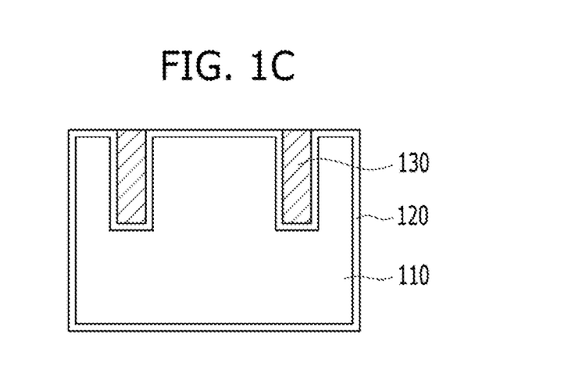

FIGS. 1A to 1C are cross sectional views illustrating forming process of a conventional TSV.

Referring to FIGS. 1A to 1C, a trench is formed in a silicon wafer 110 using an RIE (reactive ion etching) process or a laser drilling process (a).

Then, an isolation film including an insulation layer, a diffusion prevention layer and a seed layer is grown on a surface of the silicon wafer 110 (b). The TSV is formed by filling a conductive material 130 in the trench using an electroplating process, and performing a back-grinding process, a CMP (chemical-mechanic polishing) process, a thin film process and a stacking process (c).

A tungsten (W), a copper (Cu), a poly (Poly) and an aluminum (Al) are used as the conductive material.

In a TSV forming process as described above, an electrical isolation between the TSV and a silicon (Si) substrate is worked as an important factor. Herein, it is one of very difficult processes to deeply form and isolate the trench in the silicon (Si) substrate and fill the conductive material.

That is, in case that an etch is performed on the surface of the silicon substrate at a predetermined oblique angle or a vertical angle, it is very difficult to oxide a side wall of the via-hole.

A leak may be occurred when a thickness of a target region of an oxidation is uneven or a thin. Moreover, in case that the TSV including a conductive material, an oxidation layer and a silicon operates as a MOS (Metal Oxide silicon), as a capacitance increases, an insertion loss may increase.

Especially, in case of an aspect ratio is large, it is more difficult to insulate a side wall of the TSV.

DISCLOSURE

Technical Problem

Various embodiments of the present invention are directed to a method for manufacturing a TSV employs a conventional trench insulation process and efficiently accomplishes an electrical insulation between a TSV and a silicon.

Technical Solution

In accordance with an embodiment of the present invention, a method for manufacturing a TSV (through-hole silicon via) comprises forming a trench-type element isolation film on a first wafer using a trench-type element isolation process; turning over the first wafer and thinning a backside of the first wafer until the trench-type element isolation film is exposed; removing a semiconductor material of the trench-type element isolation film through a patterning and an etching process on the backside of the first wafer; and forming the TSV by filling a conductive material in the trench-type element isolation film where the semiconductor material is removed.

In accordance with another embodiment of the present invention, a method for manufacturing a TSV (through-hole silicon via) comprises forming a trench-type element isolation film on a first wafer using a trench-type element isolation process; removing a semiconductor material of the trench-type element isolation film through a patterning and an etching process; forming the TSV by filling a conductive material in the trench-type element isolation film where the semiconductor material is removed; and turning over the first wafer and thinning a backside of the first wafer until the trench-type element isolation film is exposed.

In accordance with another embodiment of the present invention, a method for manufacturing a TSV (through-hole silicon via) comprises forming a trench-type element isolation film on a first wafer using a trench-type element isolation process; bonding a second wafer on an upper portion of the trench-type element isolation film of the first wafer; turning over the first wafer and thinning a backside of the first wafer until the trench-type element isolation film is exposed; removing a semiconductor material of the trench-type element isolation film through a patterning and an etching process on the backside of the first wafer; and forming the TSV by filling a conductive material in the trench-type element isolation film where the semiconductor material is removed.

In accordance with the exemplary embodiments of the present invention, a method for manufacturing a TSV (through-hole silicon via) comprises forming a trench-type element isolation film on a first wafer using a trench-type element isolation process; removing a semiconductor material of the trench-type element isolation film through a patterning and an etching process; and forming the TSV by filling a conductive material in the trench-type element isolation film where the semiconductor material is removed; bonding a second wafer on an upper portion of the TSV of the first wafer; and turning over the first wafer and thinning a backside of the first wafer until the trench-type element isolation film is exposed.

Advantageous Effects

A method for manufacturing a TSV in accordance with embodiments of the present invention employs a conventional trench insulation process and efficiently accomplishes an electrical insulation between a TSV and a silicon.

Moreover, through a method for manufacturing a TSV in accordance with embodiments of the present invention, a TSV having various shapes according to a design rule of a conventional trench insulation process, and a metal pollution occurring in a via forming process and an error occurring by a thermal expansion coefficient difference may be removed.

BEST MODE

Hereinafter, various embodiments will be described below in more detail with reference to the accompanying drawings.

Figure 2:
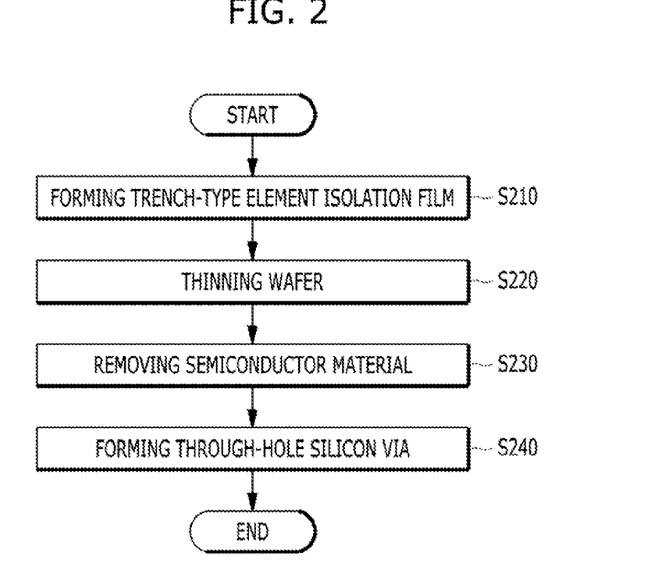
FIGS. 2 to 5 are flows charts illustrating a method for manufacturing a TSV in accordance with embodiments of the present invention.
Figure 3:
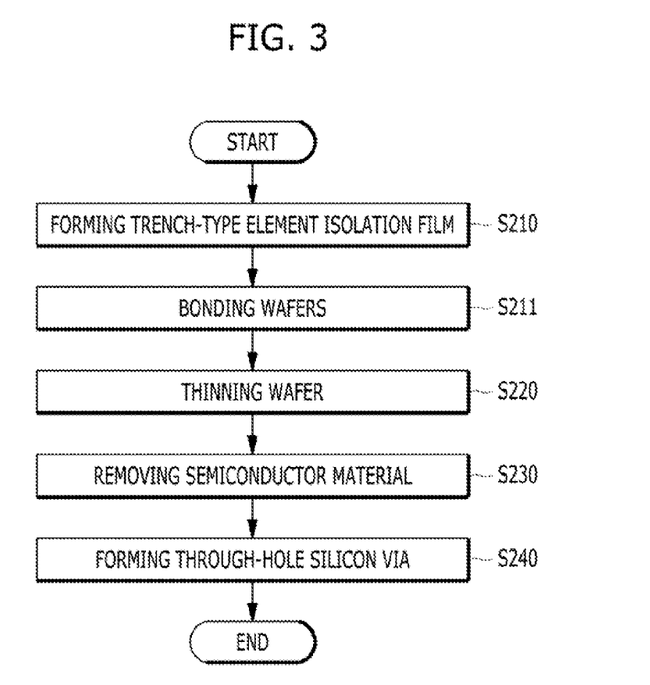

FIGS. 2 and 3 are flow charts illustrating a method for manufacturing a TSV in accordance with an embodiment of the present invention.

Referring to FIG. 2, a method for manufacturing a TSV in accordance with an embodiment of the present invention includes steps of forming a trench-type element isolation film S210, thinning a wafer S220, removing a semiconductor material S230 and forming a TSV S240.

In the step of forming the trench-type element isolation S210, a trench-type element isolation film is formed on a first wafer using a trench-type element isolation process.

In other words, the trench-type element isolation film is formed on a target region to form the TSV using the trench-type element isolation process.

Herein, a DTI (deep trench isolation) or an STI (shallow trench isolation) may be used as the trench-type element isolation process. It is preferred to use the DTI.

In the step of thinning the wafer S220, a backside of a first wafer is thinned until the trench-type element isolation film is exposed by turning over the first wafer having the trench-type element isolation film.

In the step of removing the semiconductor material S230, a semiconductor material of the trench-type element isolation film is removed through a patterning and etching process on the backside of the first wafer.

In the step of forming the TSV S240, the TSV is formed by filling a conductive material or the semiconductor material within the trench-type element isolation film where the semiconductor material is removed, and performing a planarizing process.

Herein, for an electrical insulation between the TSV and a semiconductor substrate surface, the TSV may be protrudedly formed, an oxidation layer may be formed on a protruded TSV, and then the planarization process may be performed.

It is preferred to determine a thickness of the TSV based on a thickness of the thinning in the step of the wafer thinning.

In case that the thickness of the thinning is within 10 micrometers, the TSV may be manufactured to have a smaller size based on an aspect ratio.

Referring to FIG. 3, the embodiment of the present invention may be applied to a semiconductor device having a three-dimensional stacked structure by further comprising a step of bonding a second wafer on an upper portion of the trench-type element isolation S211 after the trench-type element isolation film is formed on the first wafer.

Figure 4:
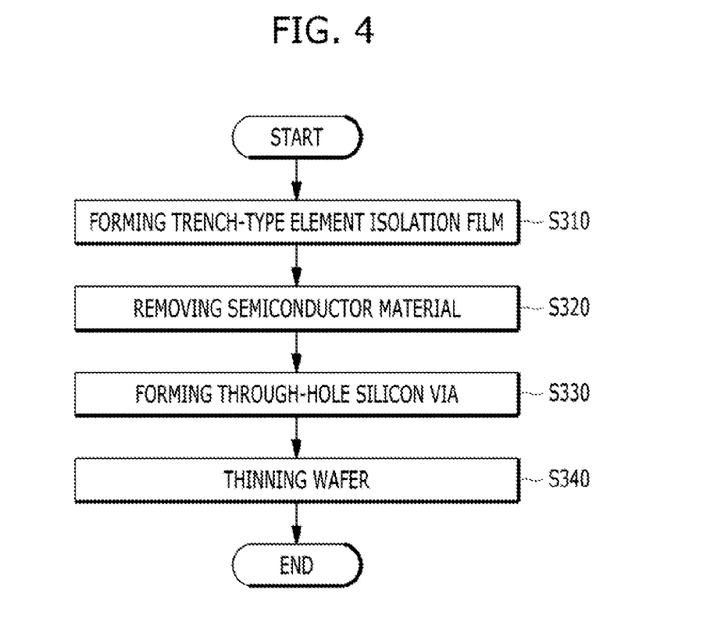
Figure 5:
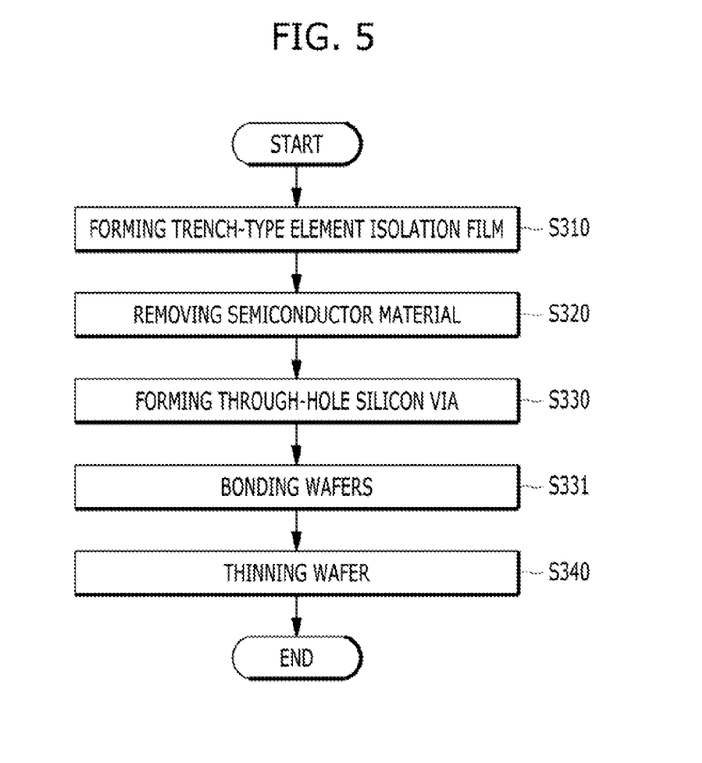
Figure 6A:
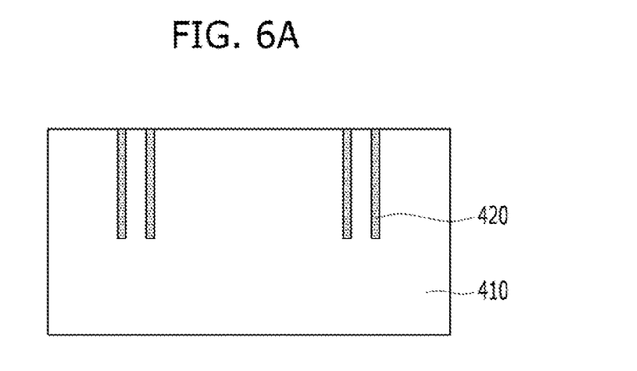
FIGS. 6a to 6f are cross sectional views illustrating a method for manufacturing a TSV in accordance with an embodiment of the present invention.
Figure 6B:
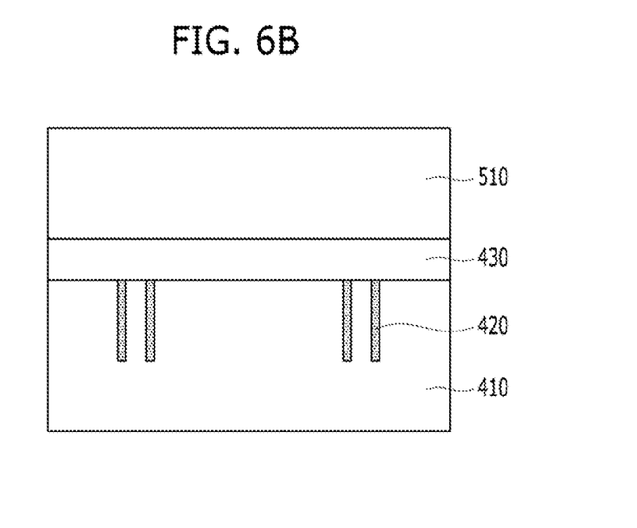
Figure 6C:
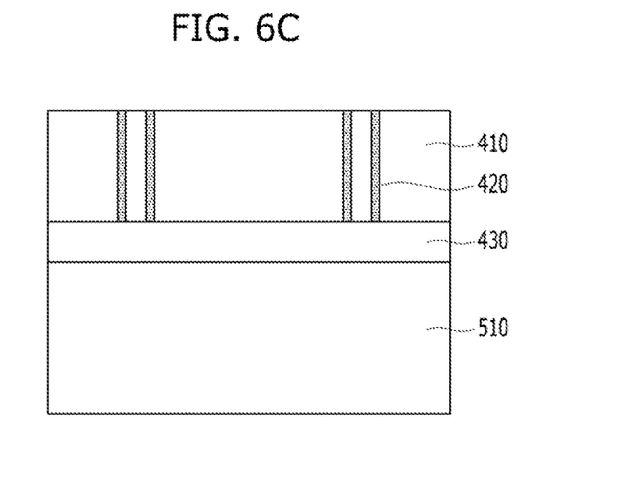
Figure 6D:
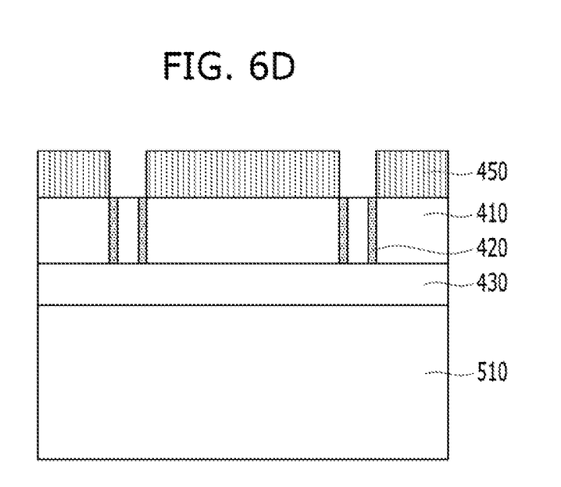
Figure 6E:
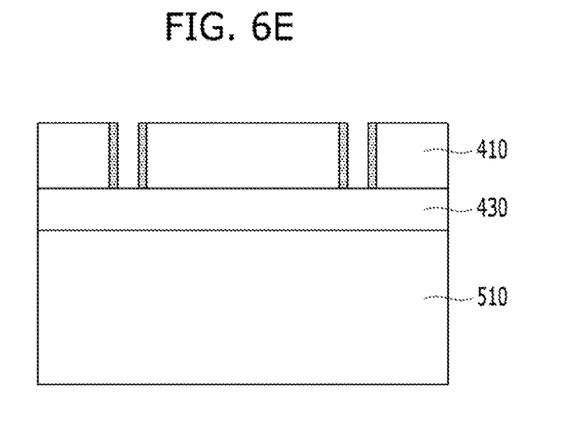
Figure 6F:
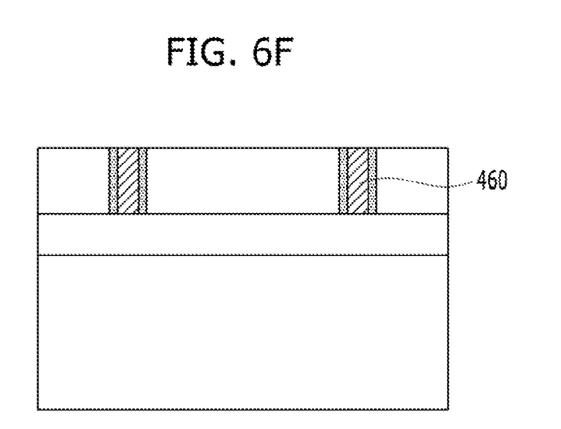
Figure 7A:
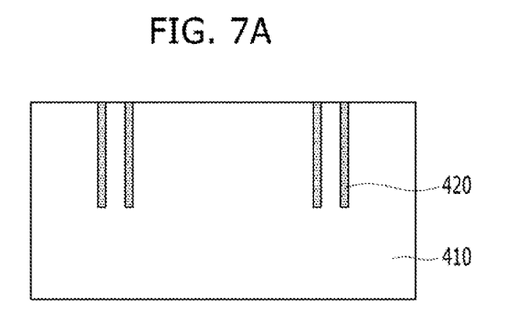
FIGS. 7a to 7f are cross sectional views illustrating a method for manufacturing a TSV in accordance with another embodiment of the present invention.
Figure 7B:
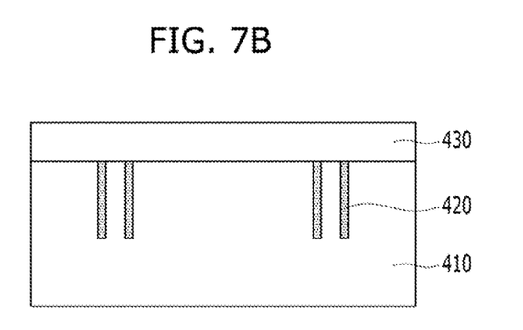
Figure 7C:
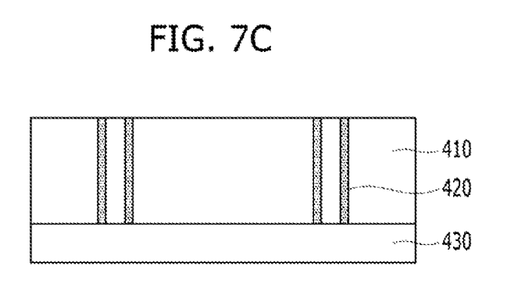
Figure 7D:
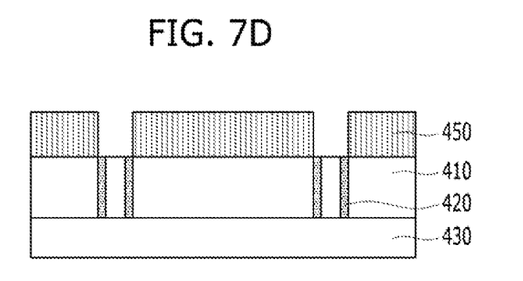
Figure 7E:
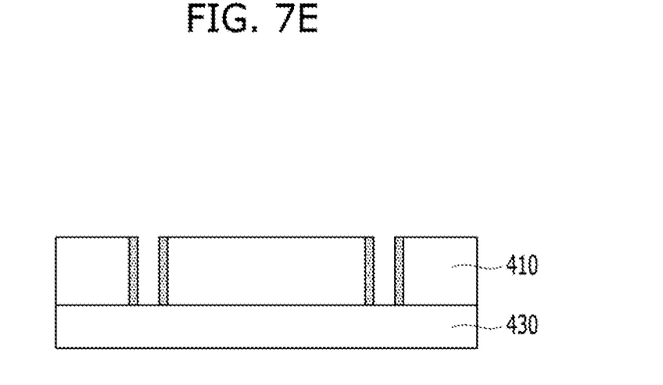
Figure 7F:
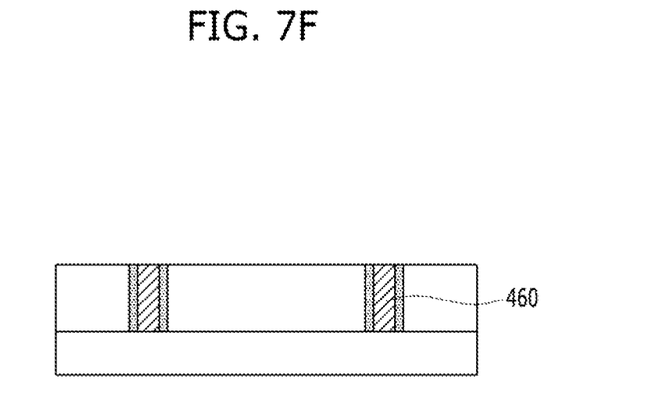

FIGS. 4 and 5 are flow charts illustrating a method for manufacturing a TSV in accordance with another embodiment of the present invention.

Referring to FIG. 4, a method for manufacturing a TSV in accordance with another embodiment of the present invention includes steps of forming a trench-type element isolation film S310, removing a semiconductor material S320, forming a TSV S330 and thinning a wafer S340.

The method for manufacturing a TSV in accordance with another embodiment of the present invention shown in FIG. 4 has a same process as a method manufacturing a TSV in accordance with an embodiment of the present invention shown in FIG. 2 except that the step of thinning the wafer 340 is performed after the step of forming the TSV S330.

Meanwhile, referring to FIG. 5, the another embodiment of the present invention may be applied to a semiconductor device having a three-dimensional stacked structure by further comprising a step of bonding a second wafer on an upper portion of the TSV S331 after the step of forming the TSV S330.

Herein, a cross section of the TSV may be manufactured to have a various shape of a circle shape or a polygonal shape according to needs of a user.

Although a method for manufacturing a TSV in accordance with embodiments of the present invention is changed according to a basic design rule, the method for manufacturing the TSV in accordance with embodiments of the present invention may be applied to implement a small TSV of sub-micrometer.

An aspect ratio of the trench-type element isolation film formed in the step of forming the trench-type element isolation film S210 is preferably ranged from 1 to 1000.

Meanwhile, the aspect ratio of the TSV in accordance with embodiments of the present invention is preferably ranged from 1 to 1000. In case of a design rule of 90 nano-meter, the aspect ratio of the TSV is ranged from 3 to 1000.

In the trench-type element isolation forming steps S210 and S310, a conductive material is filled in the trench-type element isolation film using an ozone-TEOS (TetraEthyl OrthoSilicate), TEOS, HDP (High Density Plasma), a SOG (Spin On Glass) or poly based on a characteristic of the TSV.

In the semiconductor material removing steps S230 and S320, a dry etching process or a wet etching process may be used as the process of removing the semiconductor material in the trench-type element isolation film if an etching condition between a substrate and an oxidation layer is allowed.

FIGS. 6a to 6f are cross sectional views illustrating a method for manufacturing a TSV in accordance with an embodiment of the present invention.

Referring to FIGS. 6a to 6f, a trench-type element isolation film 420 is formed in a first wafer 410 using a trench-type element isolation process. Then, an insulation layer 430 is formed, and a second wafer 510 is bonded.

The first wafer 410 is turned over and a backside of the first wafer 410 is thinned until the trench-type element isolation film is exposed.

The TSV is formed by removing the semiconductor material of the trench-type element isolation film through a patterning and an etching on the backside of the first wafer 410 of which the trench-type element isolation film is exposed, and filling the conductive material inside.

FIGS. 7a to 7f are cross sectional views illustrating a method for manufacturing a TSV in accordance with another embodiment of the present invention.

The descriptions of FIGS. 7a to 7f are omitted since FIGS. 7a to 7f are same as FIGS. 6a to 6f except that a process of bonding the second wafer on the first wafer 410 is omitted.

A method for manufacturing a TSV in accordance with embodiments of the present invention may easily and efficiently implement an electrical insulation with a semiconductor substrate, and prevent a power consumption, which occurs in an operation of a high frequency by adjusting a thickness of an isolation oxidation layer.

Although various embodiments have been described for illustrative purposes, it will be apparent to those skilled in the art, that various changes and modifications may be made without departing from the spirit and scope of the invention as defined in the following claims.

What is claimed is:

1. A method for manufacturing a TSV (through-hole silicon via) comprising:
   forming a trench-type element isolation film on a first wafer having a front side and a backside opposite to the front side using a trench-type element isolation process to define a portion of the first wafer, wherein the trench-type isolation film is formed on the front side;
   thinning the backside of the first wafer until the trench-type element isolation film is exposed through the backside of the first wafer;
   removing the portion of the first wafer through a patterning and an etching process on the backside of the first wafer; and
   forming the TSV by filling a conductive material in the trench-type element isolation film through the backside of the first wafer where the portion of the first wafer is removed.

2. The method for manufacturing the TSV of claim 1, wherein a cross section shape of the TSV is a circle shape or a polygonal shape.

3. The method for manufacturing the TSV of claim 1, wherein after thinning, when a thickness of the backside is within 10 micrometers, the TSV will have a smaller size based on aspect ratio than when the thickness of the backside is outside 10 micrometers.

4. The method for manufacturing the TSV of claim 1, wherein an aspect ratio of the TSV is ranged from 1 to 1000.

5. The method for manufacturing the TSV of claim 1, wherein in the forming of the trench-type element isolation film, a conductive material is filled in the trench-type element isolation film using an ozone-TEOS (TetraEthyl OrthoSilicate), TEOS, a HDP (High Density Plasma), a SOG (Spin On Glass) or poly.

6. The method for manufacturing the TSV of claim 1, wherein the removing of the semiconductor material in the trench-type element isolation film is performed by a dry etching process or a wet etching process.

7. The method for manufacturing the TSV of claim 1, wherein the forming of the trench-type element isolation film is performed through a deep trench-type element isolation process or a shallow trench-type element isolation process.

8. The method for manufacturing the TSV of claim 1, wherein the forming of the TSV is performed by filling a conductive material or a semiconductor material in the trench-type element isolation film.

9. The method for manufacturing the TSV of claim 8, wherein the forming of the TSV further comprises performing a planarizing process after the forming of the TSV is performed by filling a conductive material or a semiconductor material in the trench-type element isolation film.

10. A method for manufacturing a TSV (through-hole silicon via) comprising:
    forming a trench-type element isolation film on a first wafer having a front side and a backside opposite to the front side using a trench-type element isolation process to define a portion of the first wafer, wherein the trench-type isolation film is formed on the front side;
    removing the portion of the first wafer through a patterning and an etching process on the front side of the first wafer; and
    forming the TSV by filling a conductive material in the trench-type element isolation film through the front side of the first wafer where the portion of the first wafer is removed; and
    thinning the backside of the first wafer until the trench-type element isolation film is exposed.

11. The method for manufacturing the TSV of claim 10, wherein a cross section shape of the TSV is a circle shape or a polygonal shape.

12. The method for manufacturing the TSV of claim 10, wherein an aspect ratio of the trench-type element isolation film is ranged from 1 to 1000.

13. The method for manufacturing the TSV of claim 10, wherein an aspect ratio of the TSV is ranged from 1 to 1000.

14. A method for manufacturing a TSV (through-hole silicon via) comprising:
    forming a trench-type element isolation film on a first wafer having a front side and a backside opposite to the front side using a trench-type element isolation process to define a portion of the first wafer, wherein the trench-type isolation film is formed on the front side;
    bonding a second wafer on an upper portion of the trench-type element isolation film of the first wafer;
    thinning the backside of the first wafer until the trench-type element isolation film is exposed;
    removing the portion of the first wafer through a patterning and an etching process on the backside of the first wafer; and forming the TSV by filling a conductive material in the trench-type element isolation film through the backside of the first wafer where the portion of the first wafer is removed.

15. The method for manufacturing the TSV of claim 14, wherein a cross section shape of the TSV is a circle shape or a polygonal shape.

16. The method for manufacturing the TSV of claim 14, wherein an aspect ratio of the trench-type element isolation film is ranged from 1 to 1000.

17. The method for manufacturing the TSV of claim 14, wherein an aspect ratio of the TSV is ranged from 1 to 1000.

18. A method for manufacturing a TSV (through-hole silicon via) comprising:
   forming a trench-type element isolation film on a first wafer having a front side and a backside opposite to the front side using a trench-type element isolation process to define a portion of the first wafer, wherein the trench-type isolation film is formed on the front side;
   removing the portion of the first wafer through a patterning and an etching process on the front side of the first wafer; and
   forming the TSV by filling a conductive material in the trench-type element isolation film through the front side of the first wafer where the portion of the first wafer is removed;
   bonding a second wafer on an upper portion of the TSV of the first wafer; and
   thinning the backside of the first wafer until the trench-type element isolation film is exposed.

19. The method for manufacturing the TSV of claim 18, wherein a cross section shape of the TSV is a circle shape or a polygonal shape.

20. The method for manufacturing the TSV of claim 18, wherein an aspect ratio of the trench-type element isolation film is ranged from 1 to 1000.

* * * * *